United States Patent
Kovach et al.

(10) Patent No.: US 7,532,000 B2
(45) Date of Patent: May 12, 2009

(54) METHOD AND SYSTEM FOR MEASUREMENT OF CURRENT FLOWS IN FASTENER ARRAYS

(75) Inventors: Daniel J. Kovach, Kent, WA (US); Andrew M. Robb, Ravensdale, WA (US)

(73) Assignee: The Boeing Company, Chicago, IL (US)

( * ) Notice: Subject to any disclaimer, the term of this patent is extended or adjusted under 35 U.S.C. 154(b) by 432 days.

(21) Appl. No.: 11/498,634

(22) Filed: Aug. 3, 2006

(65) Prior Publication Data

US 2008/0036448 A1    Feb. 14, 2008

(51) Int. Cl.
    *G01R 33/00*    (2006.01)
(52) U.S. Cl. .............................. 324/117 H; 324/117 R; 324/126
(58) Field of Classification Search ....................... None
    See application file for complete search history.

(56) References Cited

U.S. PATENT DOCUMENTS

| | | | |
|---|---|---|---|
| 5,442,280 A | 8/1995 | Baudart | 324/127 |
| 6,313,623 B1 * | 11/2001 | Kojovic et al. | 324/127 |
| 6,680,608 B2 | 1/2004 | Kojovic | 324/127 |
| 6,822,547 B2 * | 11/2004 | Saito et al. | 336/200 |
| 7,227,442 B2 * | 6/2007 | Skendzic | 336/229 |

OTHER PUBLICATIONS

Kojovic; "High-Precision Rogowski Coils for Improved Relay Protection, Control and Measurements"; Nov. 2002; p. 7-8.

* cited by examiner

*Primary Examiner*—Minh N Tang
(74) *Attorney, Agent, or Firm*—Klein, O'Neill & Singh, LLP

(57) ABSTRACT

A method and apparatus for simultaneously measuring current flows through fasteners in a multi-structure composite joint is provided. The method comprising inserting a printed circuit board between at least two structures, the printed circuit board being etched with at least one Rogowski coil sensory circuit the at least two structures being joined with at least one fastener extending through the at least one Rogowski coil sensory circuit in the printed circuit board; detecting current in the at least one fastener; transmitting the detected current from each fastener to a corresponding passive integrator circuit for capturing transient pulses and integrating the pulses into an output; and transmitting the output to a processing unit.

17 Claims, 8 Drawing Sheets

SECTION A-A

SECTION B-B

METHOD AND SYSTEM FOR MEASUREMENT OF CURRENT FLOWS IN FASTENER ARRAYS

CROSS REFERENCE TO RELATED APPLICATIONS

None

BACKGROUND

1. Field of Invention

This invention relates generally to measuring current flows, and more particularly, to measuring the current flows in a mechanically fastened composite structural joint.

2. Background of the Invention

Traditionally aircraft have been built using aluminum as the primary airframe structural material as aluminum is an excellent electrical and thermal conductor and provides inherent lightning protection. However, structures (may also be referred to as "parts" or "components") for aircraft are increasingly being made of carbon fiber composite materials as composites have higher specific strength and stiffness. Using composite materials for fuel filled (a.k.a., wet) composite primary structures poses a significant lightning strike concern as composite structures have a diminished capacity for carrying current as compared to aluminum and are far more susceptible to damage from lightning strike attachments.

When lightning strikes a composite structure on an aircraft, it can cause a spark to occur by attaching to the composite structure such that a high amount of current traverses between various materials in the composite structure and jumps between the dielectric gaps between the various materials. As the sparking threshold for wing fuel tank composite structures vary, it is essential to understand how high-amperage currents can flow through the composite structures of the aircraft.

The risk from uncontrolled transport of current is that certain geometries are prone to developing sparks above geometry-specific threshold levels (threshold is defined as the lowest value of the peak current of a transient lightning pulse at which arcing or sparking is seen to occur). For example, one such geometry involves mechanically fastened skin-substructure joints where exposed fastener heads can conduct high currents from the aircraft exterior into metal substructures. For these geometries, the sparking threshold can be quite low (on the order of 5000 amps), due mainly to the interface between fastener collars/nuts and metal surfaces.

Directly measuring the current in fasteners has been difficult due to space limitations within a densely-fastened joint. Conventional methods for current flow measurement, such as Rogowski Coils, have been impracticable to use because of the space limitations. Rogowski coils are used for current measurement because of the large amount of electromagnetic interference (EMI) noise that is commensurate with extreme changes in current flow due to the arcing/sparking of a composite structure. Rogowski coils are immune to EMI, have a broad frequency response and are linear over a large range of current amplitudes making their use more convenient.

Aircraft manufacturers typically have to certify an aircraft against lightning strikes. How current is flowing through structures in the aircraft is an important element for such certification. However, a problem exists in that it is extremely difficult to measure current flow through individual components in a multi-component structural composite joint.

In view of the above, what is needed is a method and system for measuring current flows through individual components in a multi-component structural composite joint.

SUMMARY OF THE INVENTION

In one aspect of the present invention, a method for measuring current flows through fasteners in a multi-structure composite joint is provided. The method includes inserting a printed circuit board between at least two structures, the printed circuit board being, etched with at least one Rogowski coil sensory circuit, the at least two structures being joined with at least one fastener extending through the at least one Rogowski coil sensory circuit in the printed circuit board; detecting current in the at least one fastener using the corresponding Rogowski coil; transmitting the detected current from each fastener to a corresponding passive integrator circuit for capturing transient pulses and integrating the pulses into an output; and transmitting the output to a processing unit.

In another aspect of the present invention, a system for simultaneously measuring current flows through fasteners in a multi-structure composite joint is provided. The system includes a printed circuit board etched with at least two Rogowski coil sensory circuits, each Rogowski coil being wound in a double-helix pattern, the printed circuit board being inserted inside the joint between at least two structures joined with at least two fasteners, with the at least two fasteners extending through a corresponding Rogowski coil sensory circuit; a passive integrator array having at least two passive integrator circuits for receiving a corresponding output from each Rogowski coil sensory circuit and integrating the outputs into an array output; and a processing unit for displaying the array output.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. The illustrated embodiment is intended to illustrate, but not to limit the invention. The drawings include the following.

DETAILED DESCRIPTION OF THE PREFERRED EMBODIMENTS

The following detailed description is of the best currently contemplated modes of carrying out the invention. The description is not to be taken in a limiting sense, but is made merely for the purpose of illustrating the general principles of the invention, since the scope of the invention is best defined by the appended claims.

According to the present invention, a method and system for measuring current flows through individual components in a multi-component composite structure, such as individual fasteners in a multi-fastener structural composite joint, is provided. Although the method and system of the present invention is implemented using an aircraft in these exemplary embodiments, those skilled in the art will recognize that the principles and teachings described herein may be applied to a variety of structures with composite surfaces, such as automobiles, ships, helicopters, and trains.

Potential modifications to composite structures on aircraft are continuously being developed to provide protection against lightning. To determine if the potential modification will be effective, testing of the modified structure aircraft is required. Typically wing structures of aircraft are tested by applying various mechanical loads to the wing to determine how the wing structure flexes and then this information is compared to analytical models.

However, to determine if the modification will be effective in preventing damage from a lightning strike, current flows through individual fasteners in a multi-fastener structural composite joint are measured creating a baseline. Without the ability to measure individual current flows within an array of fasteners, the current flows cannot be determined during a lightning event. By knowing how the currents are flowing during a lightning event, it can be determined whether or not any change in design or manufacture of a composite structure has modified the flow of current in such a way as to protect against a lightning strike.

Figure 1A:
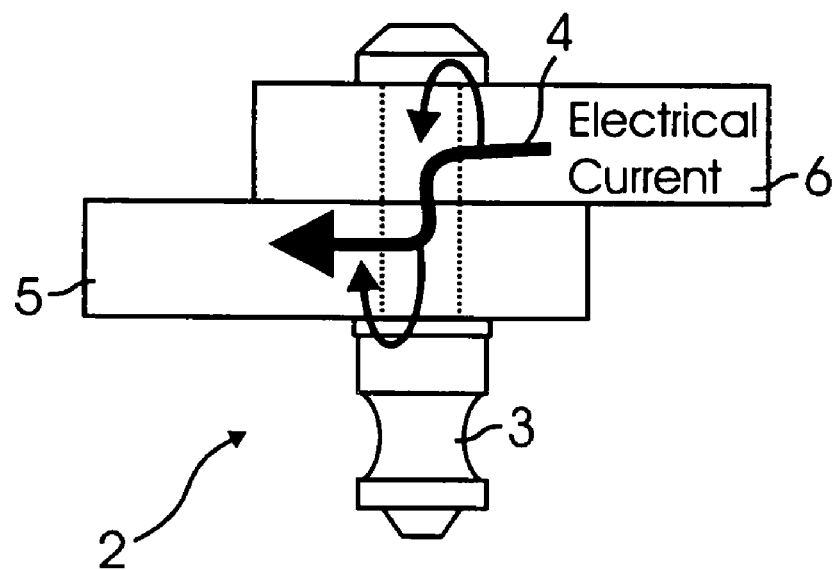
FIG. 1a illustrates a side view of the flow of current in a fastener in a carbon fiber composite.
Figure 1B:
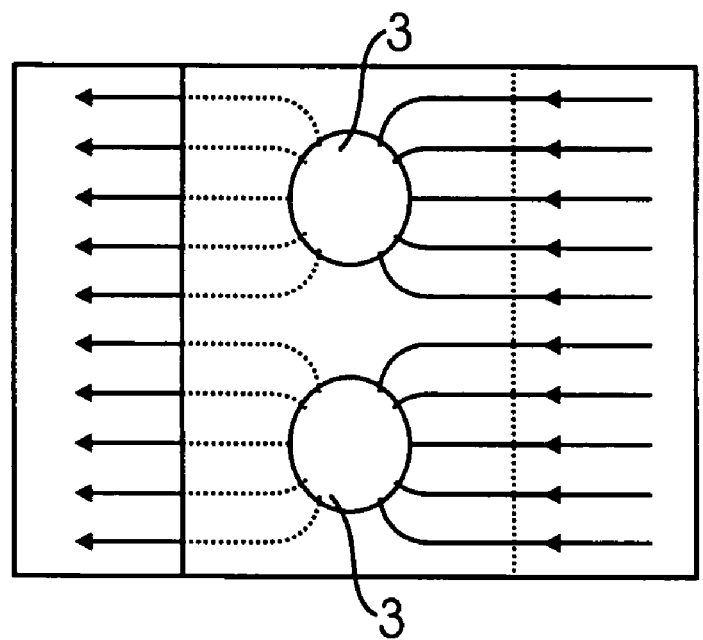
FIG. 1b illustrates a top plan view of the flow of current in a fastener in a carbon fiber composite.

Turning to FIGS. 1*a* and 1*b*, side and top views, respectfully, of the flow of current in a composite joint 2 is illustrated. Composite joint 2 comprises metallic fasteners 3 for fastening structures such as composite layers 5, 6 together. Such structures may be used in a wingskin of an aircraft. Metallic fasteners 3 cause mechanical load and electrical current 4 to be transferred between composite layers 5, 6 of the wingskins and substructures of the aircraft. Current flow 4 is forced through fasteners 3 as a result of the surface resin which prevents Fay surface electrical bonding of the carbon fiber reinforced plastic (CFRP) panels.

Composite materials/layers used for wing structures of an aircraft are comprised of fibers made of highly oriented carbon atoms, which are excellent carriers of mechanical load and electrical current. The fibers are encased in a polymeric resin substance that is capable of transferring shear loads between fibers, but are poor carriers of electrical current.

The higher the level of current (Amperage) flowing though fastener 3, the greater the likelihood of sparks emanating at the joint As the fuel tanks in aircraft are comprised of metal fasteners and composite joints, sparks emanating of the joint 2 results in sparks occurring inside the fuel tank. The effects of high current flowing through a lightning-struck fastener can be mitigated by modifying the resistance of the composite adjacent to fasteners 3 so the current flow is shared amongst adjacent fasteners. Metallic conductive materials of various forms and geometries can be added into the composite stack-up near the surface exposed to lightning to spread the current. However, to determine what forms and geometries of materials should be added, knowledge of the paths and the levels of the current flows is desirable.

Knowing the current flows provides an understanding of the transfer of electrical loads between skin and substructure by the fasteners as electrical loads concentrate in or near fasteners and if a wing is hit with a large amount of current, the current will traverse into the skin and then into the substructure. Typically the current takes the path of least impedance, from where the current goes into the structure to where the current exits the structure.

Figure 2:
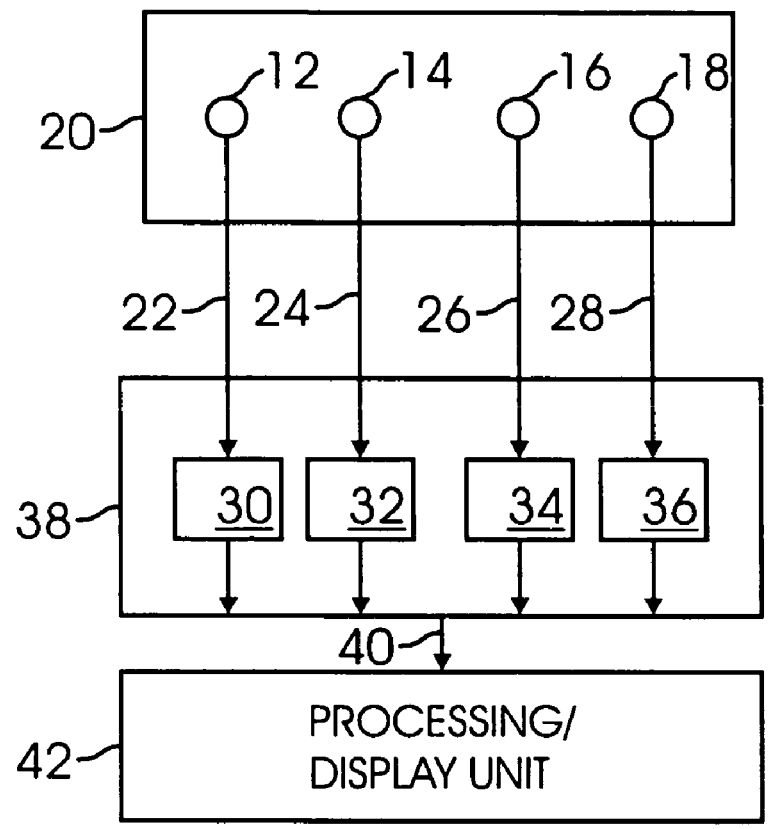
FIG. 2 illustrates a block diagram of a system for measuring current flows through individual fasteners in a multi-fastener structural composite, in a preferred embodiment of the present invention.

FIG. 2 illustrates a block diagram of a system 10 using the method of measuring current flows through individual fasteners in a multi-fastener composite structure joint. In a preferred embodiment of the present invention, trace patterns 12, 14, 16, 18 are incorporated into a printed circuit board 20. PCB 20 has a trace pattern for every fastener that is to be queried in an area. Trace patterns 12-18 form Rogowski coil sensory circuits. When designing PCB 20, the pattern of the fastener layout is known. All PCBs rely on multi-layer traces passing through a multi-layer board in specific patterns, however each PCB is custom made for each area to be queried. Each layer of PCB 20 goes through the same design and fabrication process so all of the traces are essentially balanced and the behavior of all coils will be similar because they are all built on the same board.

In one aspect of the present invention, the trace patterns 12-18 are designed using a standard PC-board Electronics Computer Aided Design (ECAD) package, such as PAREXT™ by Infinite Graphics™ of Minneapolis, Minn. Using the multilayer board technology of PCBs allow the use of multiple signal layers with dielectric core layers to support the winding of the (nearly-concentric but opposing direction) traces.

As described above, trace patterns 12-18 form an array of Rogowski coil sensory circuits 12-18 with each circuit surrounding a different fastener in a multi-fastener structural composite joint (or any other component for which the measurement of current flow is desired). Although four Rogowski coil sensory circuits 12-18 are shown, the number of circuit traces can be more than or less than four.

Rogowski coil sensory circuits 12-18 are wound so that the signal response of the circuit to the area under measurement is maximized while the response to magnetic fields external to the circuit is minimized. The use of PCB 20 provides inherent precision in terms of the impedances of the circuits and the geometries of the copper traces and dielectric regions. As described above, all of the Rogowski coil sensory circuits 12-18 for an array of fasteners are formed during the same manufacturing sequence with the same copper and dielectric materials, all circuit traces are inherently similar in geometry and material properties, thus improving the consistency of the sensing unit. It is important that the traces wrap around a maximized amount of area as the magnetic flux through that area is causing the induction of current onto the traces. As geometric features, such as the maximum desired thickness of the PCB, diameter of fasteners and spacing between fasteners limit the area that can be designed into the PCB circuit. So if all those traces had zero thickness, and zero spacing between layers, there wouldn't be any induced current on the traces.

Rogowski coil sensory circuits 12-18 detect the current on individual fasteners and each circuit 12-18 generates individual outputs (induced current vs. time histories) 22, 24, 26, 28 which are input into respective individual integrator circuits 30-36 in a passive integrator array 38. A large electrical pulse is sent through the fastener and generates magnetic fields due to the rapid changes in the pulse. Each integrator circuit 30-36 captures the transient pulses, i.e. the induced change in voltage, from PCB 20 and integrates the pulses into an array output 40 that is suitable for post-processing into the desired fastener electrical current profiles. Array output 40 is then transmitted to a processing/display unit 42, such as an oscilloscope or a network analyzer to be displayed.

Figure 3:
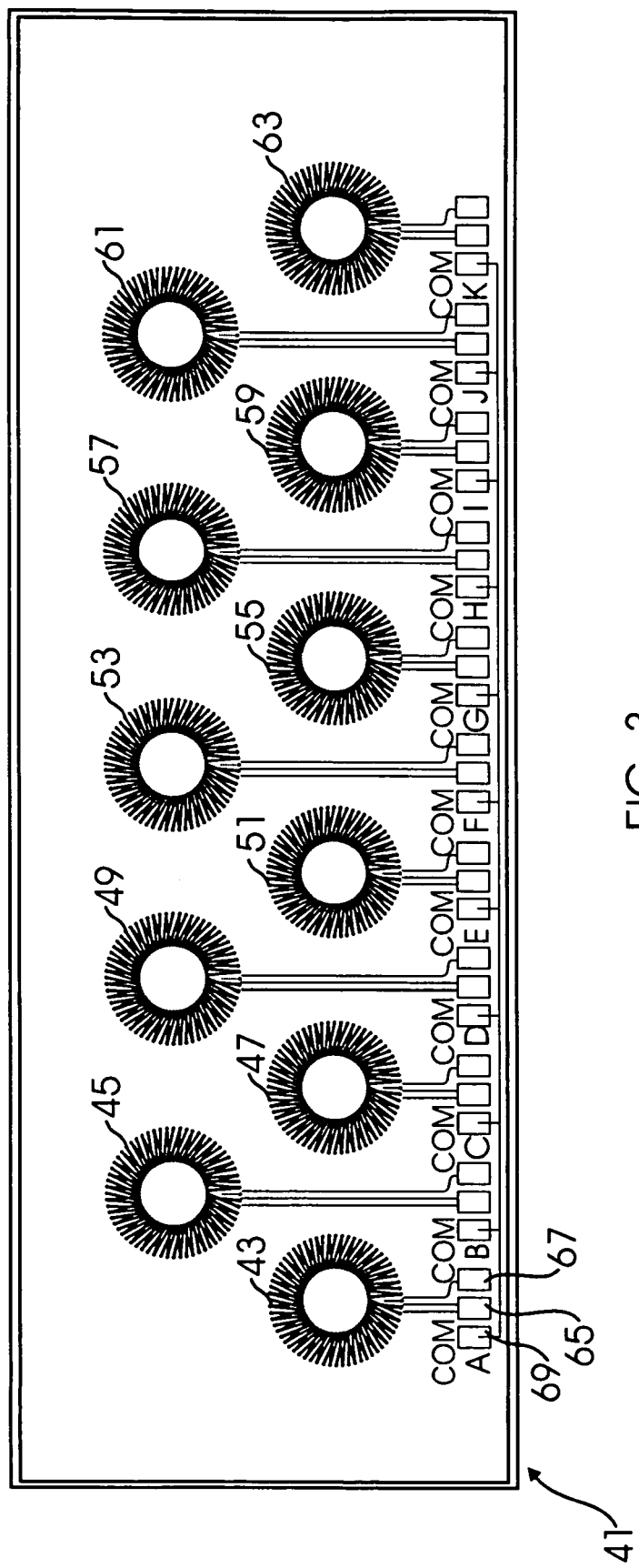
FIG. 3 illustrates a printed circuit board, etched with Rogowski coils, for measuring current flows through individual fasteners in a multi-fastener structural composite joint.

FIG. 3 illustrates a printed circuit board 41, etched with an array of Rogowski coil sensory circuits 43-63, for measuring current flows through individual fasteners in a multi-fastener structural composite joint by capturing the transient currents induced on Rogowski coils 43-63, which surround each fastener, by the magnetic fields emanating by the current flow in the devices. Rogowski coils are well known in the art for measuring current. See "High-Precision Rogowski Coils for Improved Relay Protection, Control and Measurements", pgs. 7-8, by Ljubomir Kojovic.

Each Rogowski coil is wound in a double helix pattern. The first helix encircles the fastener in a clockwise direction, while the second helix encircles the fastener in a counter-clockwise direction. The two helixes are connected to each other at one end to form a continuous coil, and the other ends of the two helixes are connected to the input leads of the respective integrator circuit via connectors 65, 67 on PCB 41. Although each circuit is shown connected to a common ground 69, this is not necessary as twisted pair wires are used to minimize EMI from the wires connecting the PCB to the integrator.

The direction of windings in the helical coils is oriented to respond to the magnetic field from current flow in the fastener such that a loop formed by a single helical coil around the fastener is eliminated. If the single loop was not eliminated, the loop would respond to magnetic fields due to current flow in the skin, introducing an unwanted response and contaminating the fastener current measurement.

Figure 4A:
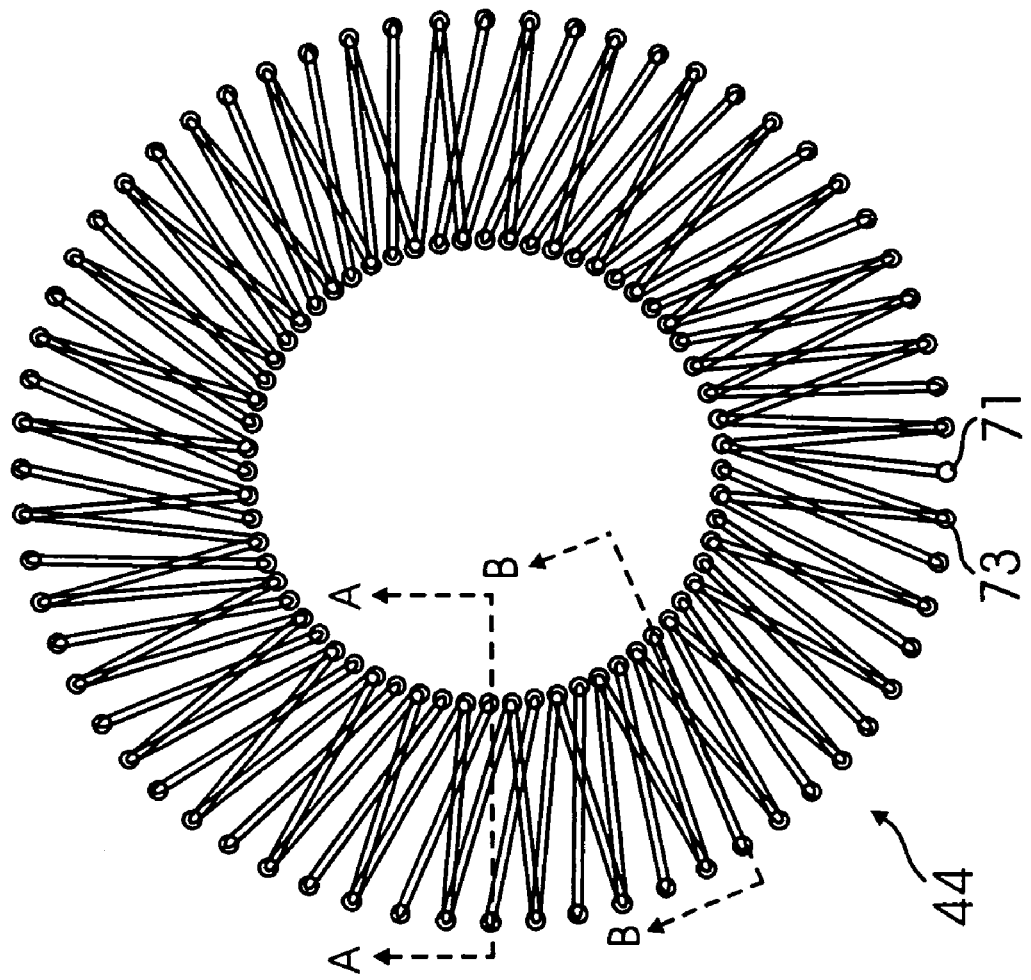
FIG. 4a illustrates an exploded view of a 4-signal-layer Rogowski coil of FIG. 3.
Figure 4B:
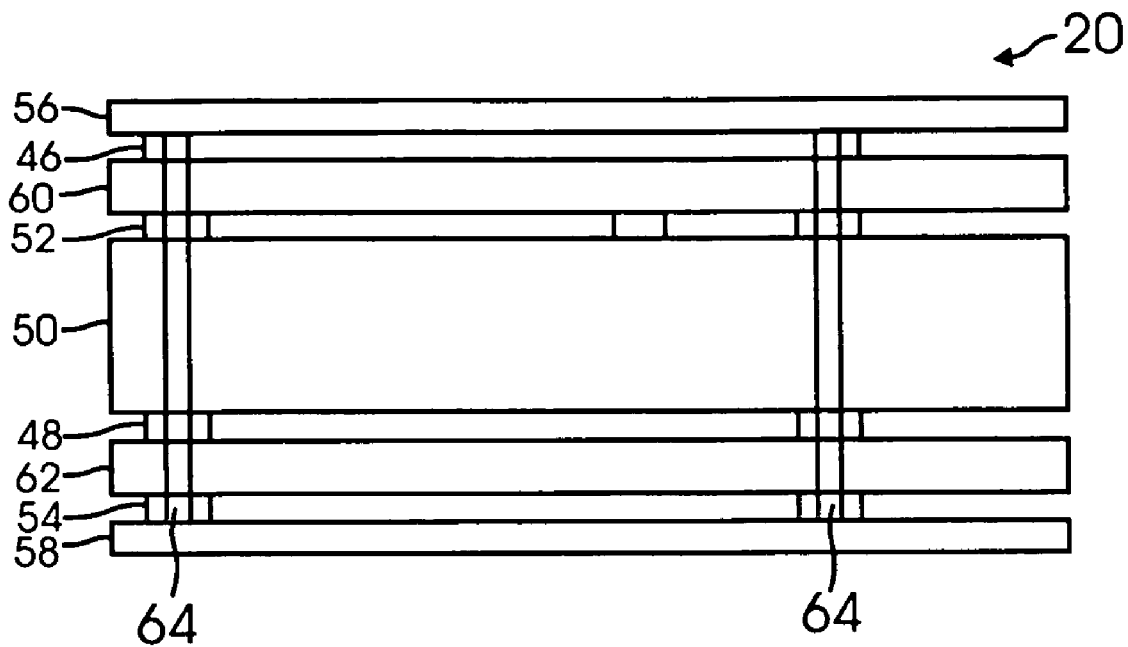
FIG. 4b illustrates a cross-section view of the Rogowski coil of FIG. 4a taken along lines A-A.
Figure 4C:
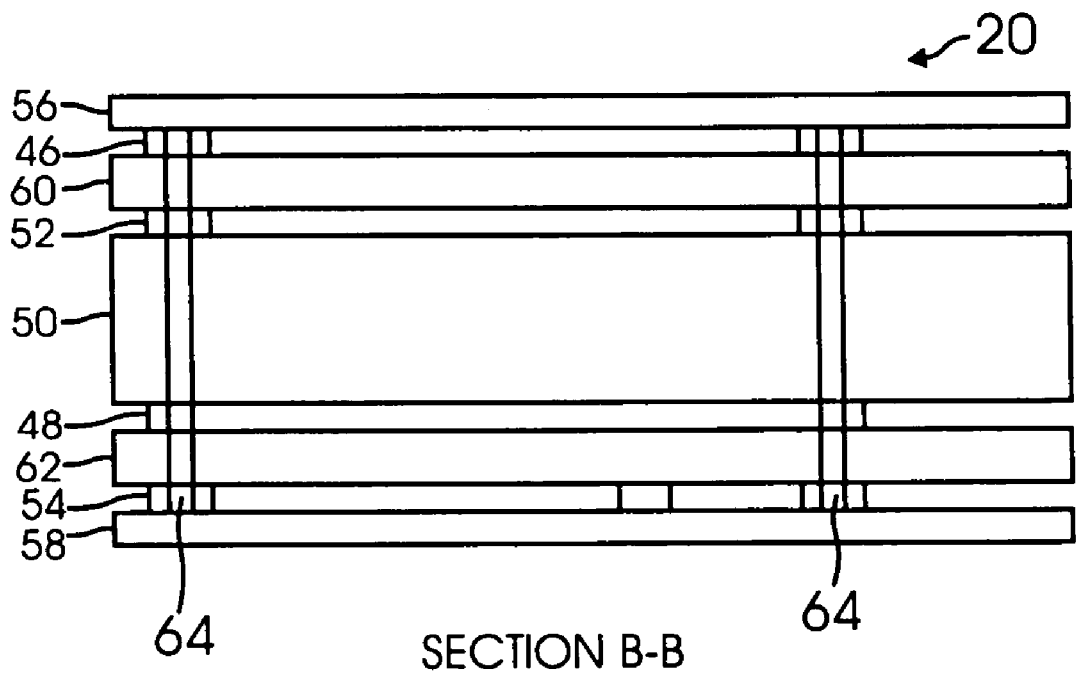
FIG. 4c illustrates a cross-section view of the Rogowski coil of FIG. 4a taken along lines B-B.

FIG. 4a illustrates an exploded view of a 4-signal-layer Rogowski coil design 44, etched into a PCB 41, having a first helix 71 and a second helix 73. FIG. 4b illustrates a cross-section view of the Rogowski coil of FIG. 4a taken along lines A-A and FIG. 4c illustrates a cross-section view of the Rogowski coil of FIG. 4a taken along lines B-B.

PCB 41 is comprised of first and third signal layers 46, 48 which represent second helix 73 while second and fourth signal layers 52, 54 represent first helix 71. A dielectric layer 50, approximately 90 mils in this case, is located between second and third signal layers 52, 48 of PCB 20 to provide increased separation (and thus cross-section) that is required in the sensing region for capturing the magnetic fields emanating from the current flow in the fasteners. The individual signal layers are connected with plated through-hole vias 64. Additionally, PCB 41 comprise soldermask layers 56, 58 on the outer layers and first and second prepreg dielectric layers 60, 62 between first and second signal layers 46, 52 and third and fourth signal layers 48, 54 respectively.

Figure 5:
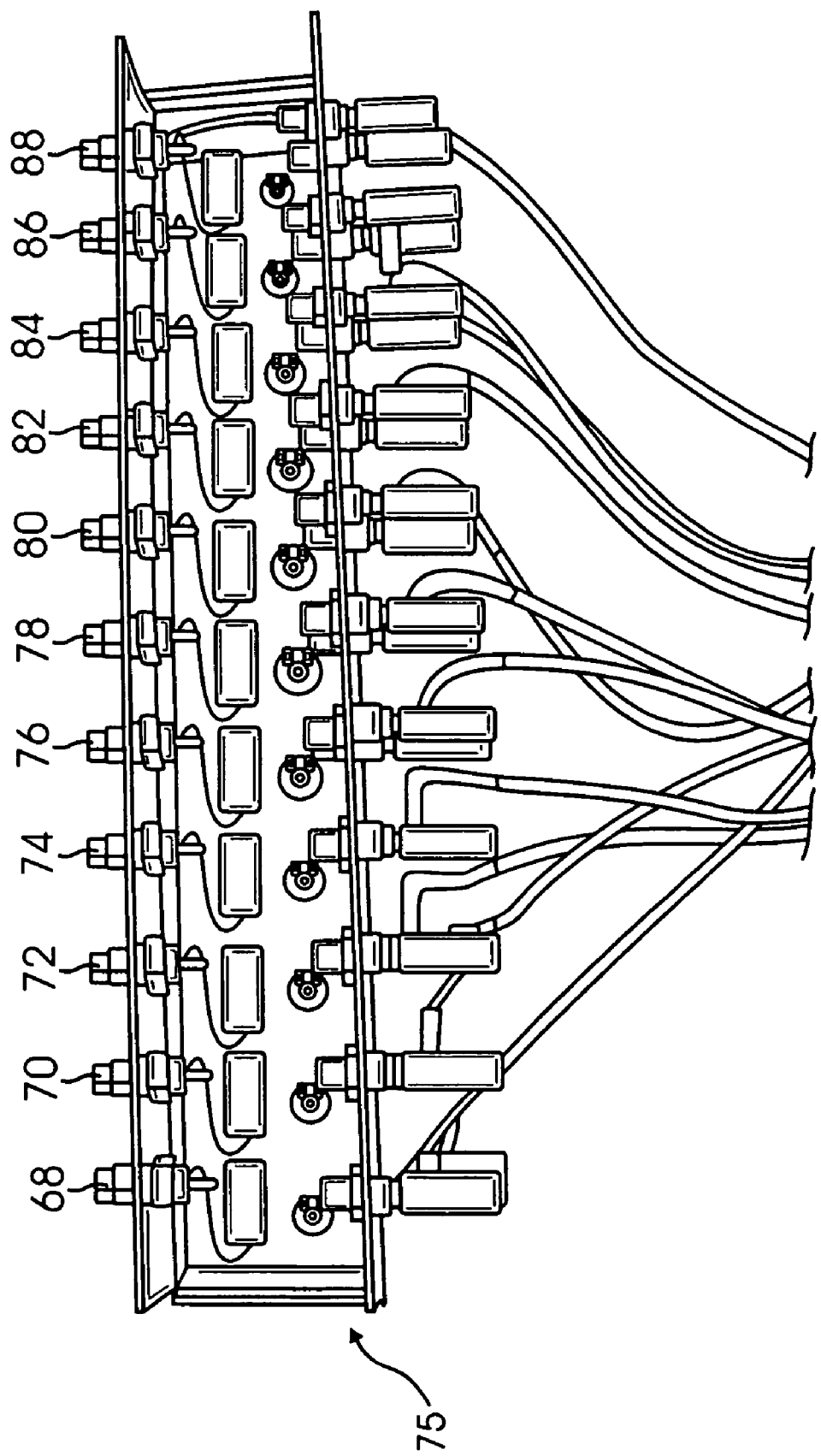
FIG. 5 illustrates a passive integrator array according to a preferred embodiment of the present invention.

FIG. 5 illustrates a passive integrator array 75 (similar to 38 of FIG. 2). Passive integrator array 75 comprises a separate integrator circuit for each fastener for capturing and analyzing the magnetically induced electrical fields emanating from the current flow in the respective fastener. Passive integrator array 75 comprises eleven (11) integrator circuits 68-88 (similar to 30-36). Although 11 integrator circuits are shown, passive integrator array can have more or less integrator circuits. Each integrator circuit captures the signal from a Rogowski coil on PCB 41 and translates the signal into the individual fastener currents and filters the noise emanating from skin currents and other Electromagnetic Interference.

Figure 6:
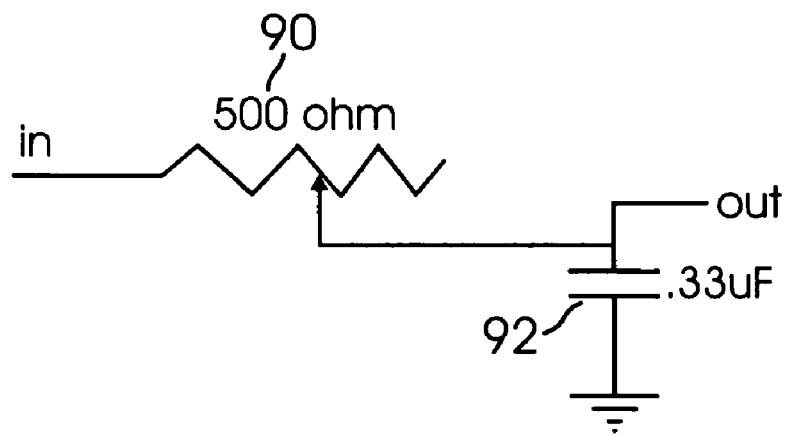
FIG. 6 illustrates a circuit diagram of each passive integrator circuit in the passive integrator array of FIG. 5.

FIG. 6 illustrates a circuit diagram of each passive integrator circuit in passive integrator array 75 of FIG. 5. The output of a Rogowski coil sensory circuit is input into a passive integrator circuit which, in this embodiment, comprises a 500 ohm variable resistor 90 and a 0.33 µF capacitor 92 that filters the noise emanating from skin currents and other Electromagnetic Interference. Each integrator circuit in FIG. 5 integrates the outputs from the Rogowski coil sensory circuits into array output 40 that is transmitted to processing/display unit 42.

Figure 7:
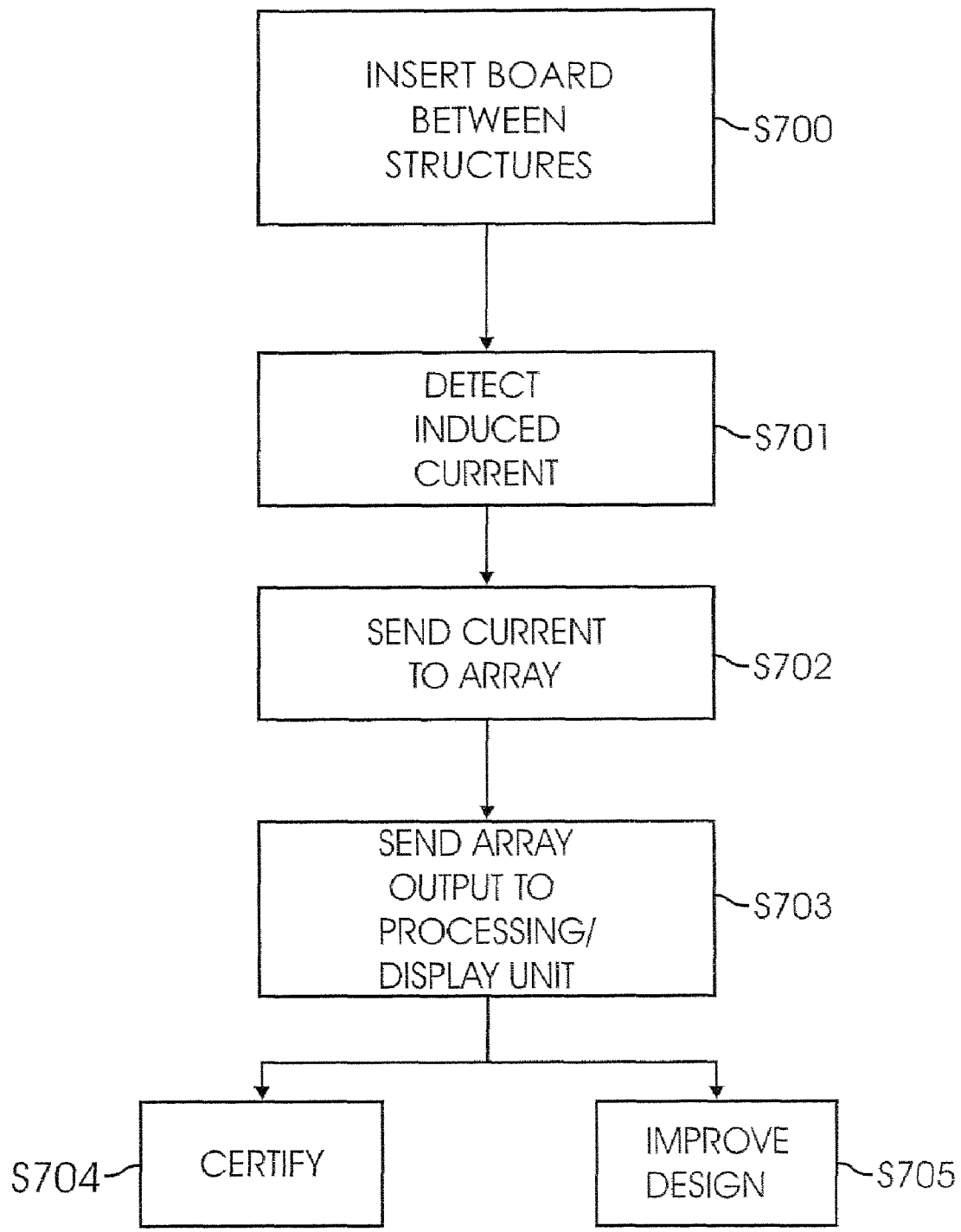
FIG. 7 illustrates a flow chart illustrating the steps of measuring current flows through individual fasteners in a multi-fastener structural composite joint.

FIG. 7 illustrates a flow chart illustrating the steps of measuring current flows through individual fasteners in a multi-fastener composite structure joint. The method begins in step S700 when PCB 20 is inserted inside the joint between two structures with the fastener extending through holes in the PCB 20, such that the fasteners are normal to PCB 20. In step S701 the induced current in the fasteners is detected during a simulated lightning strike test, for example. In step S702, the induced current is transmitted to passive integrator array 38. Induced current is not the current applied during test, but is the current that is exhibited between the two paths of each trace, Passive integrator array 38 captures the transient pulses, i.e. the induced change in voltage, from PCB 20 and integrates the pulses into array output 40 that suitable for post-processing into the desired fastener electrical current profiles. In step S703, array output 40 is transmitted to processing/display unit 42, such as an oscilloscope or a network analyzer. In step S704, output 40 is used to certify the joint design under test for an aircraft for safety. Alternatively, in step S705, output 40 is used to improve the design on structures on an aircraft to prevent sparking from a lightning strike. To determine if the modification will be effective in preventing damage from a lightning strike, current flows through individual fasteners in a multi-fastener structural composite joint are measured creating a baseline. By knowing how the currents are flowing during a lightning event, it can be determined whether or not any change in design or manufacture of a composite structure has modified the flow of current in such a way as to protect against or reduce damage from a lightning strike.

Figure 8:
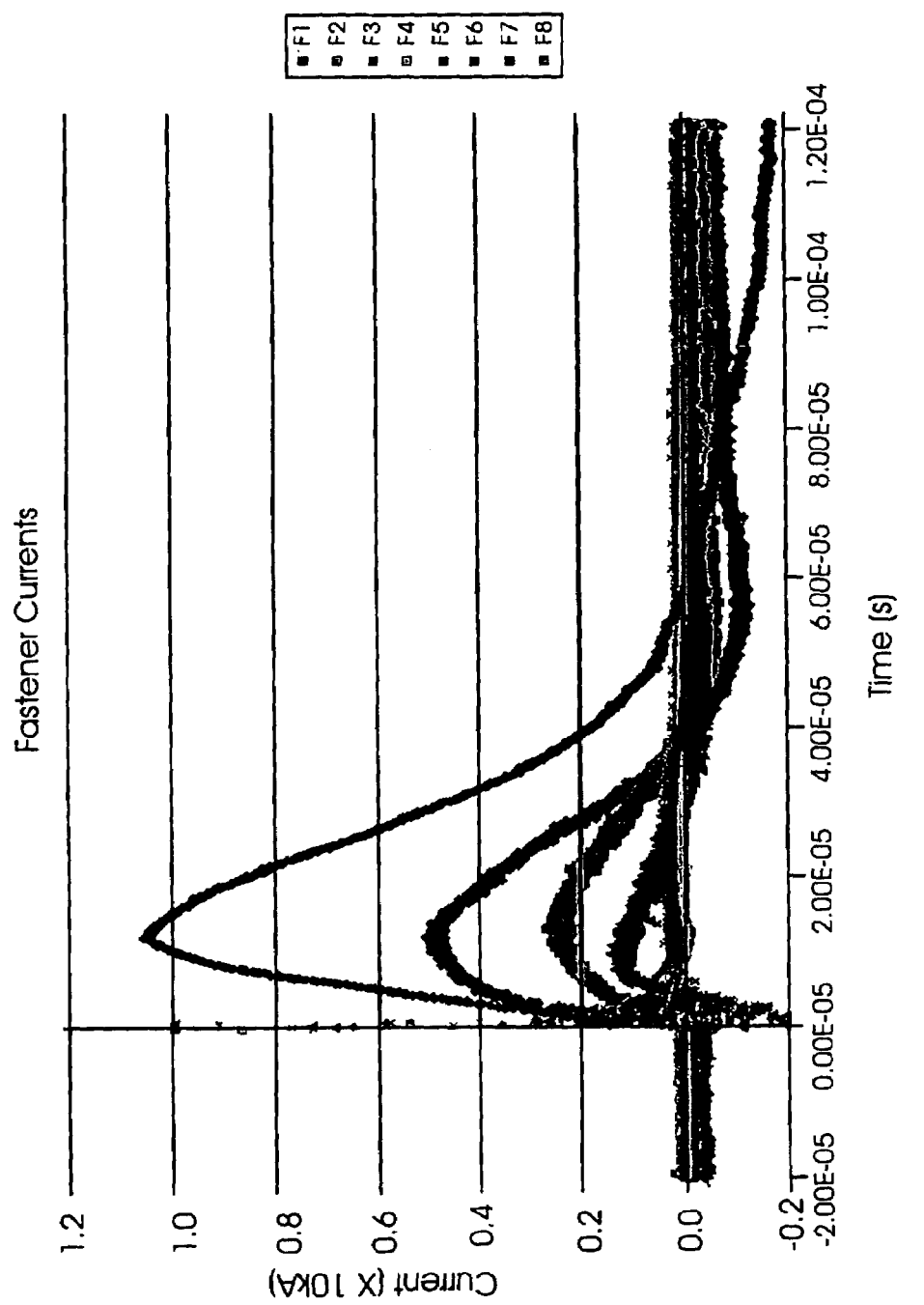
FIG. 8 illustrates an example of an array output displayed on a processing/display unit.

FIG. 8 is a graph illustrating an example of an array output displayed on processing/display unit 42. The graph shows the current flows through 8 fasteners F1-F8. The reduced current peak for the lightning-struck fastener (fastener F6) and increased current levels for the adjacent fasteners to fastener F6 are shown in the graph. By knowing the current flow in all the fasteners, it can be determined whether or not the proposed design will be effective. The method and system of the present invention can also be utilized for other design improvements for fuel tank features, such as doubler plates and fuel/hydraulic isolators.

While the present invention is described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method for measuring current flows through fasteners in a multi-structure composite joint, comprising:
    inserting a printed circuit board between at least two structures, the printed circuit board being etched with at least one Rogowski coil sensory circuit, the two structures being joined with at least one fastener extending through the at least one Rogowski coil sensory circuit in the printed circuit board;

detecting current in the at least one fastener using the corresponding Rogowski coil;

transmitting the detected current from each fastener to a corresponding passive integrator circuit for capturing transient pulses and integrating the pulses into an output; and transmitting the output to a processing unit.

2. The method of claim 1, wherein the at least two structures are joined by at least two fasteners, each fastener extending through a corresponding Rogowski coil sensory circuit, the captured transient pulses being transmitted to the corresponding passive integrator circuit, the integrator output from each passive integrator circuit being transmitted as an array output to the processing unit, for simultaneously measuring the current flows through the at least two fasteners.

3. The method of claim 2, wherein the fasteners are disposed normal to the printed circuit board.

4. The method of claim 1, wherein the processing unit is a network analyzer.

5. The method of claim 1, wherein the processing unit is an oscilloscope.

6. The method of claim 2, wherein the array output is used to at least one of certify an aircraft or to improve the design of aircraft structures in an aircraft to reduce damage to the aircraft caused by a lightning strike.

7. The method of claim 1, wherein the passive integrator circuit is comprised of at least one variable resistor connected to a capacitor for filtering out noise emanating from skin currents.

8. The method of claim 1, wherein the detected current is caused by an electrical pulse transmitted through the at least one fastener, and wherein the electrical pulse simulates a lightning strike.

9. A system for simultaneously measuring current flows through fasteners in a multi-structure composite joint, comprising:

a printed circuit board etched with at least two Rogowski coil sensory circuits, each Rogowski coil being wound in a double-helix pattern, the printed circuit board being inserted inside the joint between at least two structures joined with at least two fasteners, with the at least two fasteners each extending through a corresponding Rogowski coil sensory circuit;

a passive integrator array having at least two passive integrator circuits for receiving a corresponding output from each Rogowski coil sensory circuit and integrating the outputs into an array output; and a processing unit for displaying the array output.

10. The system of claim 9, wherein the outputs are transient pulses from the printed circuit board caused by an electrical pulse transmitted through the at least two fasteners, and wherein the electrical pulse simulates a lightning strike.

11. The system of claim 10, wherein the fasteners are normal to the printed circuit board.

12. The system of claim 9, wherein the processing unit is a network analyzer.

13. The system of claim 9, wherein the processing unit is an oscilloscope.

14. The system of claim 9, wherein the array output is used to certify an aircraft for safety.

15. The system of claim 9, wherein the array output is used to improve the design on structures on an aircraft to prevent damage from a lightning strike.

16. The system of claim 9, wherein the passive integrator circuit filters noise emanating from skin currents.

17. The system of claim 9, wherein the passive integrator circuit comprises a variable resistor connected to a capacitor.

* * * * *